United States Patent [19]
Iino et al.

[11] Patent Number: 5,844,199
[45] Date of Patent: *Dec. 1, 1998

[54] CONDUCTOR PATTERN CHECK APPARATUS FOR LOCATING AND REPAIRING SHORT AND OPEN CIRCUITS

[76] Inventors: Shinji Iino; Takashi Amemiya, both of c/o Operational Head Office, Tokyo Electron Limited, Fuchu NH Bldg. 2-30-7, Sumiyoshi-cho, Fuchu Tokyo 183, Japan

[*] Notice: The term of this patent shall not extend beyond the expiration date of Pat. No. 5,639,390.

[21] Appl. No.: 796,693

[22] Filed: Mar. 4, 1997

Related U.S. Application Data

[62] Division of Ser. No. 362,866, Dec. 23, 1994, Pat. No. 5,639,390.

[30] Foreign Application Priority Data

Dec. 24, 1993 [JP] Japan ................................. 5-347369

[51] Int. Cl.⁶ ............................ B23K 26/00; G01R 31/02
[52] U.S. Cl. ........................ 219/121.67; 219/121.65; 219/121.68; 324/523; 324/770
[58] Field of Search .................. 219/121.67, 121.68, 219/121.69, 121.72, 121.83, 121.65; 324/512, 522, 523, 525, 527, 770, 519, 501, 555, 754, 761, 765, 526

[56] References Cited

U.S. PATENT DOCUMENTS

| | | |
|---|---|---|
| 3,234,459 | 2/1966 | Brazee . |
| 3,284,704 | 11/1966 | Lamont . |
| 4,446,421 | 5/1984 | Berde . |
| 4,817,678 | 4/1989 | Dewaele ........................... 324/525 X |
| 5,124,660 | 6/1992 | Cilingiroglu . |
| 5,153,408 | 10/1992 | Handford et al. . |
| 5,175,504 | 12/1992 | Henley ....................... 219/121.68 X |
| 5,399,975 | 3/1995 | Laing et al. . |
| 5,639,390 | 6/1997 | Iino et al. ....................... 219/121.65 |

FOREIGN PATENT DOCUMENTS

| | | |
|---|---|---|
| 0052290 | 5/1982 | European Pat. Off. . |
| 56-48559 | 5/1981 | Japan . |
| 60-4802 | 1/1985 | Japan . |
| 62-55575 | 3/1987 | Japan . |
| 63-127167 | 5/1988 | Japan ................................. 324/523 |
| 63-172973 | 7/1988 | Japan ................................. 324/525 |
| 3-31894 | 2/1991 | Japan . |
| 3-116012 | 5/1991 | Japan ................................. 324/525 |
| 4-14929 | 1/1992 | Japan . |

*Primary Examiner*—Gregory L. Mills

[57] ABSTRACT

A conductor pattern test apparatus comprises a DC voltage power source for applying a predetermined DC voltage to an end of one of a plurality of conductor patterns arranged in parallel with each other, a current measurement circuit for measuring a current flowing to another conductor pattern adjacent to the one of the conductor patterns via the end by the DC voltage power source to the end, and a short-circuit position calculation circuit for calculating a resistance value from the end to a short-circuited part of the two conductor patterns adjacent to each other, based on the current value measured by the current measurement circuit and the voltage value applied by the DC power source, and locating a position of the short-circuited part based on the calculated resistance value and a resistance value of a conductor pattern having no short-circuit. A disconnect location is also obtained.

6 Claims, 9 Drawing Sheets

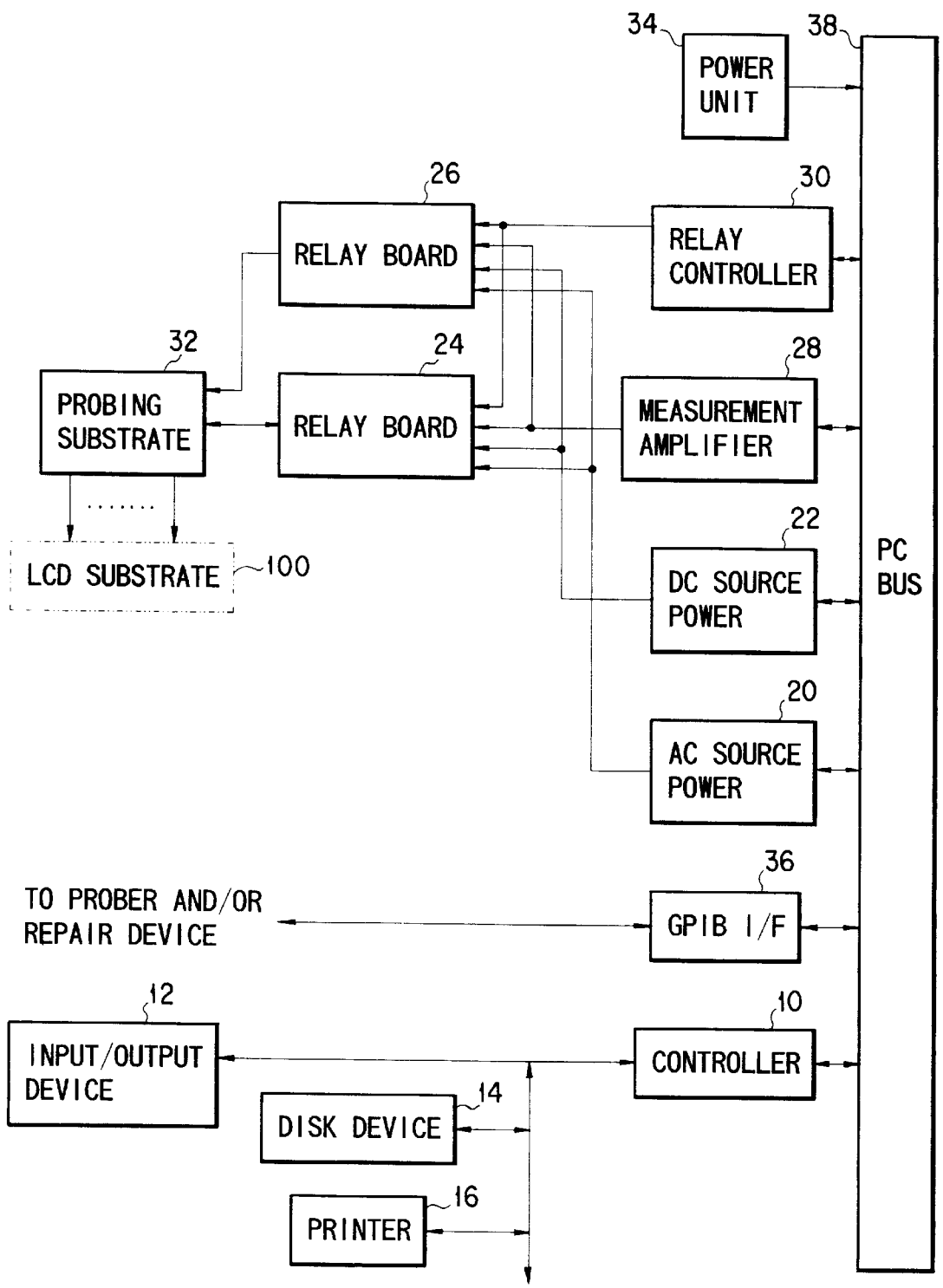
F I G. 1

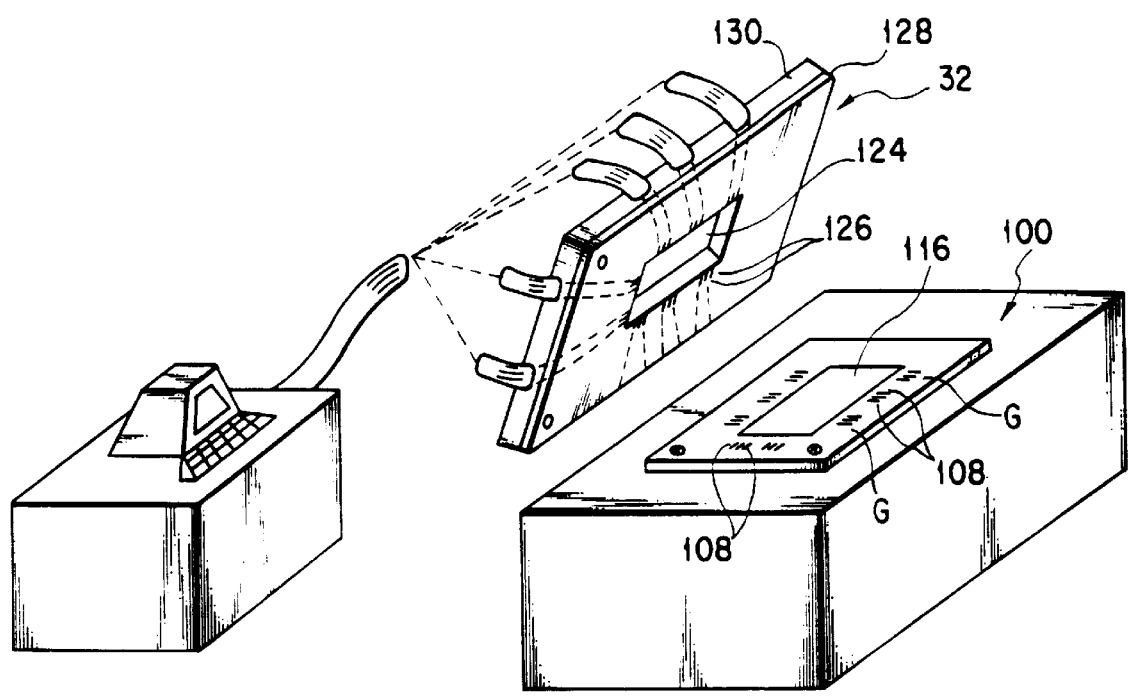
F I G. 2
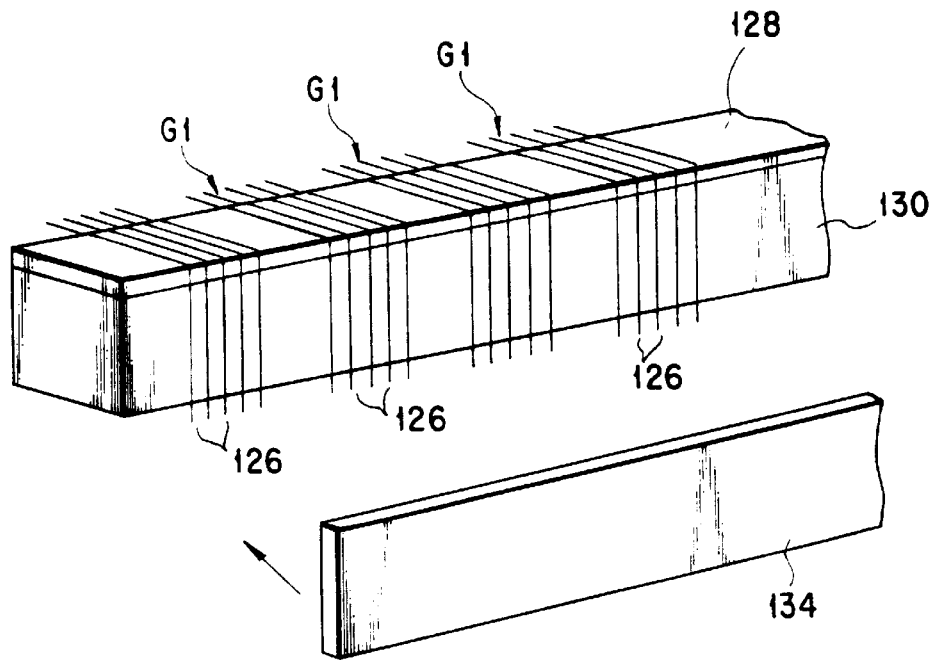
F I G. 3

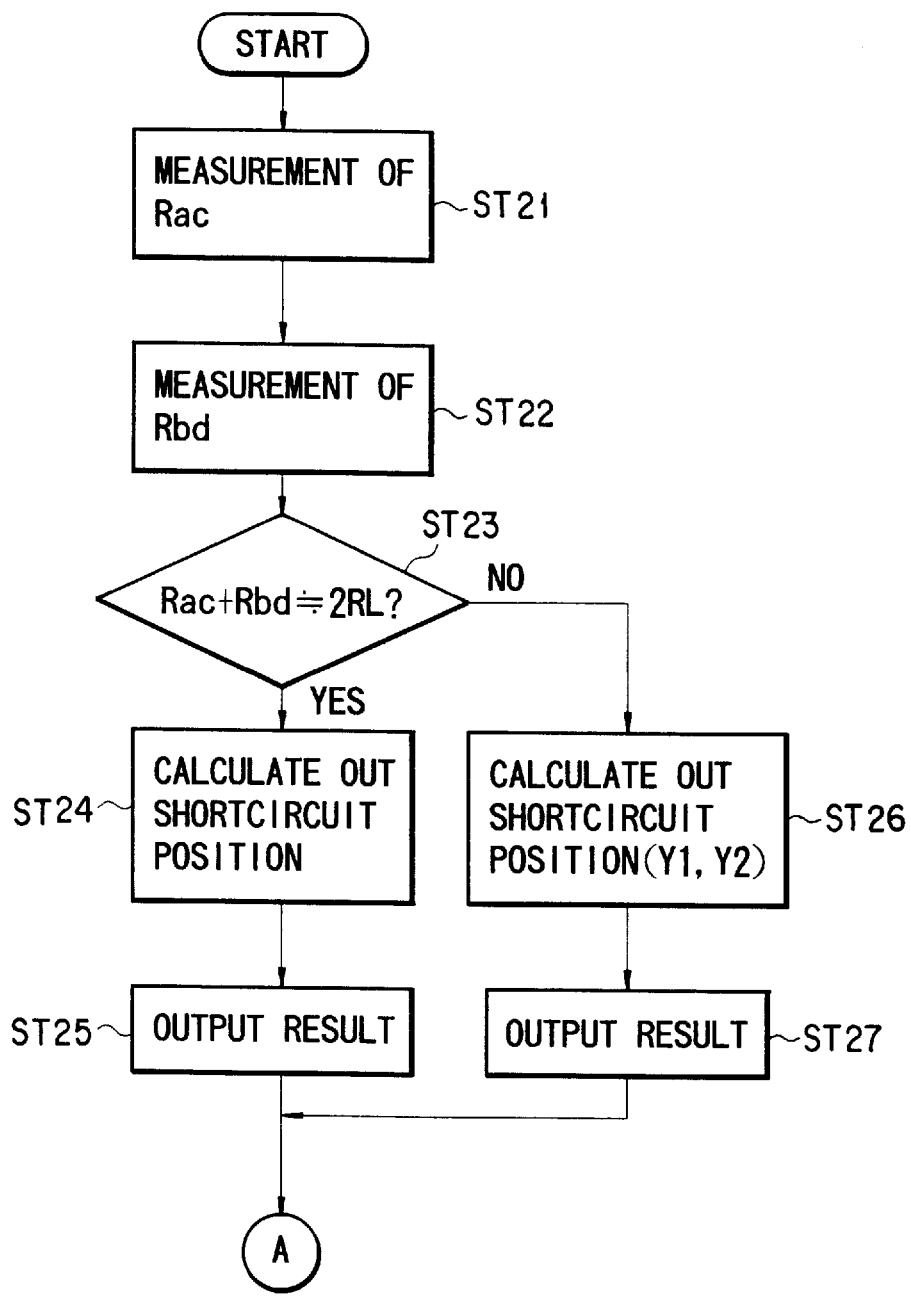
F I G. 9

CONDUCTOR PATTERN CHECK APPARATUS FOR LOCATING AND REPAIRING SHORT AND OPEN CIRCUITS

This is a Division of application Ser. No. 08/362,866 filed on Dec. 23, 1994, now U.S. Pat. No. 5,639,390.

BACKGROUND OF THE INVENTION

1. Field of the Invention

The present invention relates to a conductor pattern test apparatus for detecting a disconnection of a conductor pattern of an LCD (liquid crystal display) substrate or the like, or a short-circuit between conductor patterns.

2. Description of the Related Art

A regular LCD in which a TFT (thin film transistor) is used is presently very popular since a very high quality of image can be obtained by the LCD.

The LCD of this type has, for example, the following structure. That is, a number of TFTs are formed on a plate-like glass substrate by photolithography, and a number of LCD segments having pixel electrodes electrically connected to drain electrodes of these TFTs are situated on the glass substrate with gaps between the LCD segments and TFTs. An array of a great number of pixel units is formed by combining the TFTs with the LCD segments. More specifically, several hundred thousand pixel units each having a square shape with one side of several hundred micrometers, are arranged on a substrate, thus forming an LCD substrate.

Transparent conductive electrodes common to a great number of pixel units are arranged to face to each other on such an LCD substrate, with gaps therebetween, and then liquid crystal is sealed in the gaps, thus obtaining an LCD.

As the patterns of LCD substrates are fined down and the capacity thereof is increased, a fault such as disconnection or short-circuit of gate electrodes or drain electrodes of an TFT is naturally likely to occur, due to fine particles entering during the manufacture process. However, when such an error is detected after sealing the gap with liquid crystal by a test, no repair is no longer possible. Therefore, the test of disconnection or short-circuit in each electrode is carried out in the process stage of an LCD substrate.

In this test, the resistance of each gate electrode or drain electrode is measured, for example, before the LCD substrate is subjected to a later manufacturing step, so as to judge whether an error is based on a disconnection, or the resistance across adjacent gate electrodes or adjacent drain electrodes is measured to judge whether an error is based on a short-circuit.

However, with the conventional tester, only the conduction test for testing whether or not a gate electrode or a drain electrode is disconnected, and the insulation test for testing whether or not adjacent gate electrodes or adjacent drain electrodes are short-circuited are carried out. Under such circumstances, the fault position of the disconnection or short-circuit cannot be located with such a tester.

In order to repair a fault part, the fault position must be located before the repair, which is time and labor consuming. For example, as a fault position locating method, there is a technique in which the electrode detected to have a fault is magnified, and the fault position is searched by naked eye. However, with this fault position locating technique, it is difficult to automatize a series of manufacturing steps including the repair process which takes place after the location of the fault position, thus taking an extremely long time to complete all the steps including the repair.

SUMMARY OF THE INVENTION

The object of the present invention is to provide a tester capable of detecting a disconnected part of conductor patterns such as gate electrodes, or detecting a short-circuited part between conductor patterns such as gate electrodes.

According to the present invention, there is provided a conductor pattern test apparatus including: a DC voltage power source for applying a predetermined DC voltage to an end of one of a plurality of conductor patterns arranged in parallel with each other; a current measurement circuit for measuring a current flowing to another conductor pattern adjacent to the one of the conductor patterns via the end by the DC voltage power source; and a short-circuit position calculation circuit for calculating a resistance value from the end to a short-circuited part of the two conductor patterns adjacent to each other, based on the current value measured by the current measurement circuit and the voltage value applied by the DC voltage applying circuit, and locating a position of the short-circuited part based on the calculated resistance value and an inherent resistance value of a conductor pattern having no short-circuit.

There is further provided, according to the present invention, a conductor pattern test apparatus including: an AC voltage power source for applying a predetermined AC voltage to an end of one of a plurality of conductor patterns arranged in parallel with each other; a voltage measurement circuit for measuring a voltage at an end of another conductor pattern adjacent to the one of the conductor patterns when the AC voltage is applied to the conductor pattern by the AC power source; and a disconnection position calculation circuit for calculating a capacitance value from the end to a disconnected part of the one and the other conductor patterns, based on the voltage value measured by the voltage measurement circuit and the voltage value applied by the AC power source, and locating a position of the disconnected part based on the calculated capacitance value and an inherent capacitance value of conductor patterns adjacent to each other, which have no disconnection.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a diagram showing an entire structure of a conductor pattern test apparatus according to the first embodiment of the present invention;

FIG. 2 is a perspective view illustrating an appearance of a conductor pattern test apparatus;

FIG. 3 is a diagram briefly illustrating contact elements of probes;

FIG. 9 is a flowchart illustrating the flow of the short-circuited part locating operation in the test;

DETAILED DESCRIPTION OF THE PREFERRED EMBODIMENTS

Figure 4:
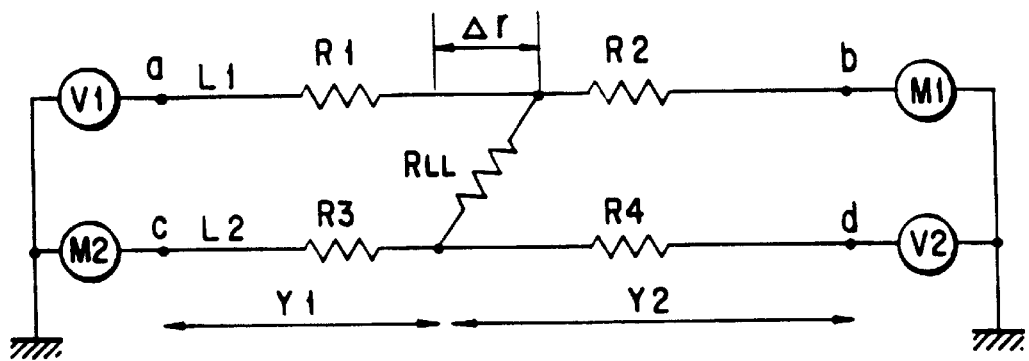
FIG. 4 is a circuit diagram illustrating the principle of the conduction test and the insulation test.

A conductor pattern test apparatus shown in FIG. 1 judges (1) whether or not gate electrodes or drain electrodes provided on an LCD substrate 100 having a number of pixel units each consisting of TFTs and LCD segments are disconnected; (2) whether or not adjacent gate electrodes or drain electrodes are short-circuited; and (3) locates (detects or finds) the fault positions of these.

In the conductor pattern test apparatus, a controller 10, an AC power source 20, a DC power source 22, a measurement amplifier 28, a relay controller 30, a power source unit 34 and a GPIB interface (GPIB I/F) 36 are connected to each other via a PC BUS 38. The controller 10 is connected to an input/output device 12, a disk device 14 and a printer 16. Relay boards 24 and 26 are controlled by the relay controller 30, and serve to selectively connect the AC power source 20 and the DC power source 22 to a probe substrate 32, which is brought into contact with the LCD substrate 100.

The controller 10 is provided for controlling the operation of the entire tester, and is the main section of a personal computer including a microprocessor. The input/output device 12 is designed to carry out the input/output of data with respect to the controller 10, and includes a keyboard and a display. The disk device 14 stores various types of data including initial data and test results, and the printer 16 print outs the data on a recording paper.

The AC power source 20 applies an AC voltage of a predetermined frequency to each of the gate electrodes or the drain electrodes of the LCD substrate 100, and includes, for example, two power sources so that an AC voltage can be applied at two sections at the same time. The AC power source 20 is used mainly to specify the disconnected portion of gate electrodes or drain electrodes.

The DC power source 22 applies a predetermined DC voltage to each of the gate electrodes or the drain electrodes of the LCD substrate 100, and includes, for example, two power sources so that a DC voltage can be applied at two sections at the same time. The DC power source 22 is used to, apart from specifying the disconnected portion, detect the disconnection and short-circuit of gate lines, and specify a short-circuited portion. The relay board 24 has a plurality of relays which respectively correspond to a plurality of gate electrodes formed on the LCD substrate 100. When each of the relays on the relay board 24 is switched, the AC power source 20 or DC power source 22 or the measurement amplifier 28, which will be described later, is electrically connected to gate electrodes on the LCD substrate 100 via a plurality of probes (later described) of the probe substrate 32.

The probe substrate 32 has a plurality of probes which are brought into contact with both ends of the gate electrodes of the LCD 100 and both ends of the drain electrodes, and serves to connect the conductor pattern test apparatus of this embodiment to the electrodes on the LCD substrate 100. The structure of the probe substrate 32 and the method of connecting the probing substrate 32 and the LCD substrate 100 will be described later in detail.

The relay controller 30 is designed to control the ON/OFF operation of each relay contained in the relay boards 24 and 26. More specifically, in order to turn on each reply, power is supplied to the relay coil which constitutes the relay so as to close the relay contact.

The measurement amplifier 28 includes a resistance which measures a current flowing through the gate electrodes or drain electrodes of the LCD 100 and converts a measurement current into a very small voltage, and a built-in amplifier for amplifying the voltage between both ends of the resistance, and an A/D (analog/digital) converter for carrying out a predetermined sampling operation on this amplified output and converting the sampled output into digital data. The measurement amplifier 28 converts a detected current into, for example, 16-bit digital data, and outputs the digital data.

The source power unit 34 applies an operation voltage to each of the member described above. The GPIB interface 36 serves to connect, for example, the laser repair machine and the conductor pattern test apparatus of this embodiment to each other by GPIB.

The controller 10, the GPIB interface 36, the AC power source 20, the DC power source 22, the measurement amplifier 28, the relay controller 30 and the power unit 34 are connected with each other via the PC BUS 38. With this connection, an instruction is sent from the controller to other circuits, or the input/output of the measurement result is carried out.

The input/output device 12, the disk device 14 and the printer 16 are connected to the controller 10, and thus, the input/output of data between the controller 10 and the input/output device 12 or the like is carried out.

FIG. 2 is a perspective view illustrating the conductor pattern test apparatus, the probe substrate 43 and the LCD substrate, and FIG. 3 shows contact elements of probes.

As can be seen in FIGS. 2 and 3, the probe substrate 32 has an area slightly wider than that of the LCD substrate 100, so that the probe substrate 32 can cover the entire LCD substrate 100 located underneath, at once. The LCD substrate 100 is made of, for example, soda glass. In the portion of a display surface 116 which corresponds to a long side of the outer periphery thereof, six pad groups (in the figure, only three of them are shown) each prepared by arranging one hundred and sixty drain electrode pads 108 each having, for example, dimensions of 100 $\mu$m×100 $\mu$m at an interval of, for example, several hundred micrometers, are arranged at an appropriate interval. Therefore, in each of the two long sides of the LCD substrate 100, for example, nine hundred and sixty electrode pads 108 are formed. In one shorter side of the outer periphery of the display surface 116, for example, four hundred and eighty gate electrode pads 108 are formed at the same interval as mentioned above.

The probe substrate 32 used for testing the LCD substrate 100 has an opening 124 having substantially the same size as that of the display surface 116 of the LCD substrate 100 at its center portion. The probe substrate 32 has a number of probe needles 126 as contact elements, each having a diameter of, for example, 100 $\mu$m, which is called "Sapphire" (trade name) prepared by, for example, gold-plating tungsten or steel wire, arranged along the periphery of the opening portion 124, a substrate 128 for holding and aligning the probe needles 126, and a support plate 130 for holding and fixing the substrate 128.

The probe needles 126, as shown in FIG. 3, are divided into a plurality of groups along the longitudinal direction of the opening end portion 130 of the substrate 128 such as to correspond to the set positions of the electrode pads 108 of the LCD substrate 100. Each of the probe needle groups G1 includes one hundred and sixty probe needles 126 as in the case of pad group G; however, FIG. 3 illustrates only five probe needles 126 to simplify the explanation.

A holding board 134 is mounted on the substrate 128 so as to interpose the probe needles 126 between the probe substrate 32 and the holding board 134, from the outer side. Further, while the holding board 134 is set on, the probe needles 126 inside are allowed to be slightly movable. Thus, the entire portions of the probe needles 126 are resiliently bent while the tips of the probe needles 126 are being in contact with the electrode pads 108 of the LCD substrate 100, thus assuring an accurate electrical contact between the probe needles and the electrode pads 108.

Next, the operational principle of the conductor pattern test apparatus having the above structure will be briefly described. It should be noted that there are two types of LCD substrates 100 to be connected to this apparatus, and one should be selected in accordance with the connection state of the gate or drain electrodes. More specifically, there are a type in which all the gate electrodes or drain electrodes are formed so as to be separated from each other, and a type having a guard ring, in which one ends of the gate electrodes or drain electrodes are connected, for example, alternately with each other. In the case of the type having a guard ring, the guard ring must be removed when the LCD is completed by actually sealing it with liquid crystal.

The operational principle of the conducting test for testing whether or not gate electrodes or drain electrodes are disconnected, will be described. The description will be provided only with regard to the conducting test of the gate electrodes, because the same description can be applied to the drain electrode.

FIG. 4 is designed to illustrate the principle of the conducting test and an insulation test which will be described later, and shows an equivalent circuit to two gate electrodes arranged adjacent to each other. In this figure, reference numerals a and b represent electrode pads 108 provided on both ends of one gate electrode (L1). The gate electrode L1 formed between the electrode pads 108 is one conductor in practice; however it is supposed for convenience that the electrode L1 has two sections having resistance values R1 and R2. When the line resistance of one gate electrode is represented by RL, the following equation:

$$RL = R1 + R2 \qquad (1)$$

is established.

Similarly, reference numerals c and d represent electrode pads 108 provided on both sides of one gate electrode (L2) provided adjacent to the above gate electrode. The gate electrode L2 formed between the electrode pads 108 is in practice one conductor; however it is supposed for convenience that the electrode L2 has two sections having resistance values R3 and R4. Since the line resistance of one gate electrode is represented by RL, the following equation:

$$RL = R3 + R4 \qquad (2)$$

is established.

In FIG. 4, reference numeral V1 represents the DC power source 22 connected to one electrode pad 108 of the gate electrode L1 via the relay board 24 (or the relay board 26 in the case of drain electrode) and the probe substrate 32, and the applied voltage (DC voltage) is V1. Similarly, reference symbol V2 represents the voltage of the DC power source 22 connected to one electrode pad 108 of the gate electrode L2, and the applied voltage (DC voltage) is V2. The applied voltages V1 and V2 are set at a value less than 40 V.

In this figure, M1 represents the measurement current value of the measurement amplifier 32 connected to the other electrode pad 108 of the gate electrode L1 via the relay board 24 (or the relay board 26 in the case of drain electrode) and the probe substrate 32. Similarly, M2 represents the detection current value of the measurement amplifier 28 connected to the other electrode pad 108 of the gate electrode L2.

In the above-described wiring state, a voltage V1 is applied to one end of the gate electrode L1, and the current M1 is measured at the other end. In this measurement, it is compared if the resistance V1/M1 of the gate electrode obtained by the current measurement is substantially equivalent to the designed line resistance RL of the gate electrode L1 (or the actual line resistance of the gate electrode which has been confirmed to be in a normal condition). In the case where the above V1/M1 value is larger than the designed line resistance RL, it is judged that a part of the gate electrode L1 is disconnected.

Similarly, a voltage V2 is applied to one end of the gate electrode L2, and the current M2 is measured at the other end. In this measurement, it is compared if the resistance V2/M2 of the gate electrode L2 obtained by the current measurement is substantially equivalent to the designed line resistance RL of the gate electrode L2. In the case where the above V2/M2 value is larger than the designed line resistance RL, it is judged that a part of the gate electrode L2 is disconnected.

The above-described line conduction test can be carried out regardless of the presence of a guard ring.

Next, the operational principle of the insulation test between lines in which adjacent gate electrodes are short-circuited or not, in the case where no guard ring is provided, will be described.

In FIG. 4, reference symbol RLL represents a leak resistance between gate electrodes adjacent to each other. In the case shown in FIG. 4, the section of the gate electrode L1 starting from the left end and including the resistance R1 and the section of the gate electrode L2 starting from the left end and including the resistance R3 are connected via the leak resistance RLL.

In such a connection state (short-circuited state), a voltage V1 is applied to the left end of the gate electrode L1 from the DC power source 22, and at the same time, the measurement amplifier 28 is connected to the left end of the gate electrode L2 so as to measure the current value M2. The leak resistance RLL is obtained using the resistance V1/M2 obtained from the measurement by the following equation:

$$RLL = V1/M2 - (R1 + R3) \qquad (3)$$

In practice, the value (R1+R3) cannot be obtained if the leaking cannot be located; however the V1/M2 takes a very large value if there is no leaking. Consequently, the leak resistance RLL takes a large value, and it can be judged that the gate electrodes L1 and L2 are not short-circuited.

Similarly, a voltage V2 is applied to the right end of the gate electrode L2 from the DC power source 22, and at the same time, the measurement amplifier 28 is connected to the right end of the gate electrode L1 so as to measure the current value M1. The leak resistance RLL is obtained using the resistance V2/M1 obtained from the measurement by the following equation:

$$RLL=V2/M1-(R2+R4) \quad (4)$$

Therefore, as in the above-described case, when the V2/M1 value takes a large value, it can be judged that the gate electrodes L1 and L2 are not short-circuited.

Alternatively, the respective sides of the equations (3) and (4) are added to obtain the following equation:

$$\begin{aligned} 2RLL &= V1/M2 + V2/M1 - (R1+R2+R3+R4) \\ &= V1/M2 + V2/M1 - 2RL \end{aligned} \quad (5)$$

Therefore, even more accurate leak resistance RLL can be obtained by measuring V1/M2 and V2/M1. When this resistance value is larger than a predetermined value, it can be judged that the gate electrodes L1 and L2 are not short-circuited.

Figure 6:
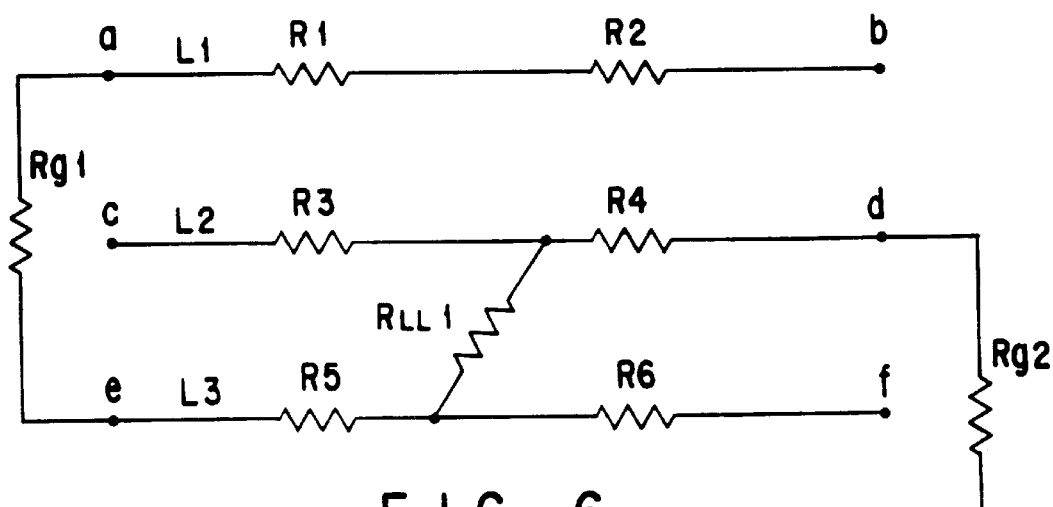
FIG. 6 is a circuit diagram illustrating the insulation test when a guard ring is contained.

FIG. 6 is designed to illustrate the principle of the insulation test in the case where a guard ring is provided, and shows an equivalent circuit to three gate electrodes arranged adjacent to each other. This figure illustrates that one ends (left ends) of odd-numbered gate electrodes are connected to each other, or one ends (right ends) of even-numbered gate electrodes are connected to each other vie a guard ring.

In FIG. 6, reference symbols a to f represent electrode pads 108 provided for the end portions of the gate electrodes, and symbols R1 to R6 represent the resistances of divisions in the case where the gate electrodes are imaginarily divided at appropriate locations. Further, symbol RLL1 represents a leak resistance, and Rg1 and Rg2 represents resistances of the guard ring. In this circuit, the leak current created by the leak resistance RLL1 between the gate electrodes L2 and L3 is generated via the resistance Rg1 of the guard ring even if there is no leaking between the gate electrodes L1 and L2 due to insulation failure, and therefore the gate electrodes between which a leak actually occurs, cannot be determined.

In order to locate a leaking position, the current values between the sections a–c, c–e, b–d and d–f are measured, so as to find the minimum leak path. Thus, the line in which a leak actually occurs can be determined.

The resistances between lines, measured by connecting the DC power source 22 and the measurement amplifier 28 respectively to electrode pads 108 adjacent to each other, are:

$$Ra\text{-}c=Rg1+R5+RLL1+R3 \quad (6)$$

$$Rc\text{-}e=R5+RLL1+R3 \quad (7)$$

$$Rb\text{-}d=Rg1+R5+RLL1+R4+R1+R2 \quad (8)$$

$$Rd\text{-}f=RLL1+R4+R6 \quad (9)$$

Of these equations, Rc–e or Rd–f is minimum, and thus it can be determined that a leak occurs between the gate electrodes L2 and L3. In the case where no leak occurs, RLL1 takes a very large value, and therefore the resistances between lines take very large values. Consequently, it can be judged that no leak occurs.

Next, the operational principle of the location of a short-circuited part after a leak is discovered by in the insulation test for adjacent lines, will be described.

The above equation (3) can be rewritten into the following:

$$V1/M2=RLL+R1+R3 \quad (10)$$

The actual distance between gate electrodes is extremely short as compared to the pattern width (the longitudinal length of the gate electrode), the leak resistance RLL is so small that it is negligible. In the case where two gate electrodes are actually short-circuited, the resistances R1 and R3 should be substantially the same, i.e. R1=R3. Based on this, the formula (10) can be rewritten into:

$$R1=V1/(2\times M2) \quad (11)$$

Therefore, a distance Y1 from the left end of a gate electrode to the short-circuit portion can be expressed by using the pattern width X of each gate electrode and the line resistance RL as the following equation:

$$\{[V1/(2\times M2)]/RL\}^{\cdot}X$$

$$Y1=\{V1/(2^{\cdot}M2^{\cdot}RL)\}^{\cdot}X \quad (12)$$

Since the values for RL and X are known, the distance Y1 can be obtained based on the DC current V1 applied to point a shown in FIG. 4 and measurement current M2 in point c. The short-circuit point can be located.

Similarly, the distance Y2 from the right end of the gate electrode to the short-circuit position Y2 is expressed by using the pattern width X and the line resistance RL as in the following formula:

$$Y2=\{V2/(2^{\cdot}M1^{\cdot}RL)\}^{\cdot}X \quad (13)$$

Therefore, the distance Y2 can be obtained based on the DC voltage V2 applied to point d shown in FIG. 4 and the measurement current M1, and therefore the short-circuit position can be located.

In the case where the width of the short-circuit portion is narrow, the sum of Y1 and Y2, (Y1+Y2) is substantially equal to the pattern width X of the gate electrode.

When the width of the short-circuit portion is large, an error is created when the short-circuit position is calculated directly from the measurement value. More specifically, an error, i.e. Y3=X−(Y1+Y2) appears due to the influence of the width of a short-circuit portion. Similarly, errors are created also in the case where short-circuit occurs at a plurality of parts between two gate electrodes.

It should be noted that a short-circuit position can be detected regardless of the presence of a guard ring. In the case where there is a guard ring as shown in FIG. 6, and a leak occurs between a plurality of pairs of gate electrodes, the accuracy of the measurement of the leak resistance RLL is affected; however, the detection accuracy of a short-circuit position is not affected, and the position can be precisely located.

Next, the operational principle of locating a disconnected position after discovering the disconnection in the line conduction test will now be described.

The location of a disconnection is carried out basically in the following manner. That is, a capacitor between two gate electrodes is supposed, and the capacitance ratio between two capacitor portions divided by a disconnection of a gate electrode. Based on the capacitance ratio, the disconnection can be located.

Figure 5:
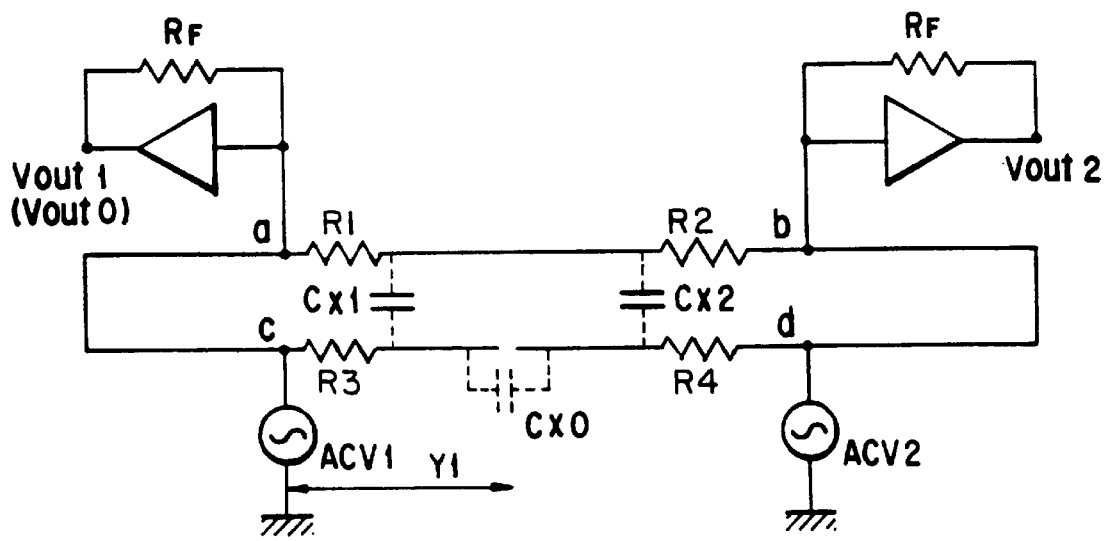
FIG. 5 is a circuit diagram illustrating the operational principle for locating the position of a disconnected part.

FIG. 5 is designed to illustrate the operational principle of locating the disconnected position, and shows an equivalent circuit to the case where the AC power source 20 and the measurement amplifier 28 are connected to two gate electrodes arranged adjacent to each other.

In FIG. 5, ACV1 and ACV2 represent AC voltage applied from the AC power source 20, and the AC voltages are selectively applied to the electrode pad represented by symbol c and the electrode pad represented by symbol d.

Symbol RF represents a resistance connected in parallel with a built-in amplifier of the measurement amplifier 28, and the resistance is used to integrate the output from the built-in amplifier. More specifically, when an AC current voltage is applied to the capacitor, the input AC voltage is differentiated, and the differentiated signal is output. Therefore, the resistance represented by RF and the built-in amplifier of the measurement amplifier 28 are used to integrate the differentiated output, thus obtaining the capacitance of the capacitor.

Symbols C×1 and C×2 respectively represents the capacitances of two gate electrodes. The former one represents the capacitance on the left side with respect to the disconnected part, and the latter represents the capacitance of the right side with respect to the disconnected part. Therefore, in the case where the width of the disconnected part is small, the sum of these capacitances, (C×1+C×2) is substantially the same as the entire capacitance C× between the gate electrodes. It should be noted that C×0 represents the capacitance of the section of the gate electrode which includes the disconnected part.

First, with the above-described connection, a capacitance CL between normal (not including a disconnection) gate electrodes is measured. The right ends (b and d) are disconnected, and the AC voltage ACV1 from the AC power source 20 is applied to the point c. At the same time, the measurement amplifier 28 is connected to the point a, and an output voltage Vout of the built-in amplifier of the measurement amplifier 28 is measured. An output voltage Vout0 of the measurement amplifier can be expressed by the following equation:

$$Vout0 = RF \times i \tag{14}$$

where i represents a current flowing through the gate electrode. The current flowing through the resistance R1 can be neglected of the gain of the amplifier is sufficiently high, and therefore the following equation can be obtained.

$$i = j\omega \times CL \times ACV1 \tag{15}$$

Therefore, the following equation can be established:

$$|Vout0| = \omega \cdot CL \cdot RF \cdot ACV1 \tag{16}$$

The equation (16) can be rewritten in terms of CL as follows:

$$CL = \frac{|Vout0|}{|ACT1|} \times \frac{1}{\omega \cdot RF} \tag{17}$$

An amplified output Vout0 of the amplifier in the case where there is a disconnection between the points c and d, and a capacitance of C×0 is input, can be obtained by the following formula:

$$|Vout1| = \omega \left( CX1 + \frac{CX0 \cdot CX2}{CX0 + CX2} \right) RF \cdot ACT1 \tag{18}$$

The value C×0 is sufficiently small as compared to C×1 or C×2, and therefore the C×0 value can be regarded as 0, C×0=0. Thus, if the C×0=0 is substituted in the equation (18), the following equation can be obtained.

$$CX1 = \frac{|Vout1|}{|ACT1|} \times \frac{1}{\omega \cdot RF} \tag{19}$$

From the equations (17) and (19), the ratio between CL and C×1 is equal to the ratio between Vout0 and Vout1, and therefore the distance Y1 from the left end of the gate electrode to the disconnected part can be obtained by the following equation:

$$\begin{aligned} Y1 &= X \times (C \times 1/CL) \\ &= X \times (Vout1/Vout0) \end{aligned} \tag{20}$$

Similarly, when the AC source power 20 is connected to the point d of FIG. 5, and the measurement amplifier 28 is connected to the point b, a distance Y2 from the right end of the gate electrode to the disconnected part can be obtained. In the case where the width of a disconnected part is small, the sum of Y1 and Y2 becomes substantially the same as the pattern width X of the gate electrode.

In the case where there is a guard ring as shown in FIG. 6, the entire capacity of the gate electrode is connected in parallel with each other, and therefore the calculated capacitance becomes larger than the capacitance between a pair of gate electrodes. In this case, the distance to the disconnected part can be obtained on the basis of the capacitance ratio, that is, the detected voltage ratio (Vout1/Vout0).

In the case where there are a plurality of disconnections on the same line, the distance to the first disconnected part from the left or right end of the gate electrode can be obtained.

Next, a series of test operations using the conductor pattern test apparatus of this embodiment shown in FIG. 1 will be described.

Figure 7:
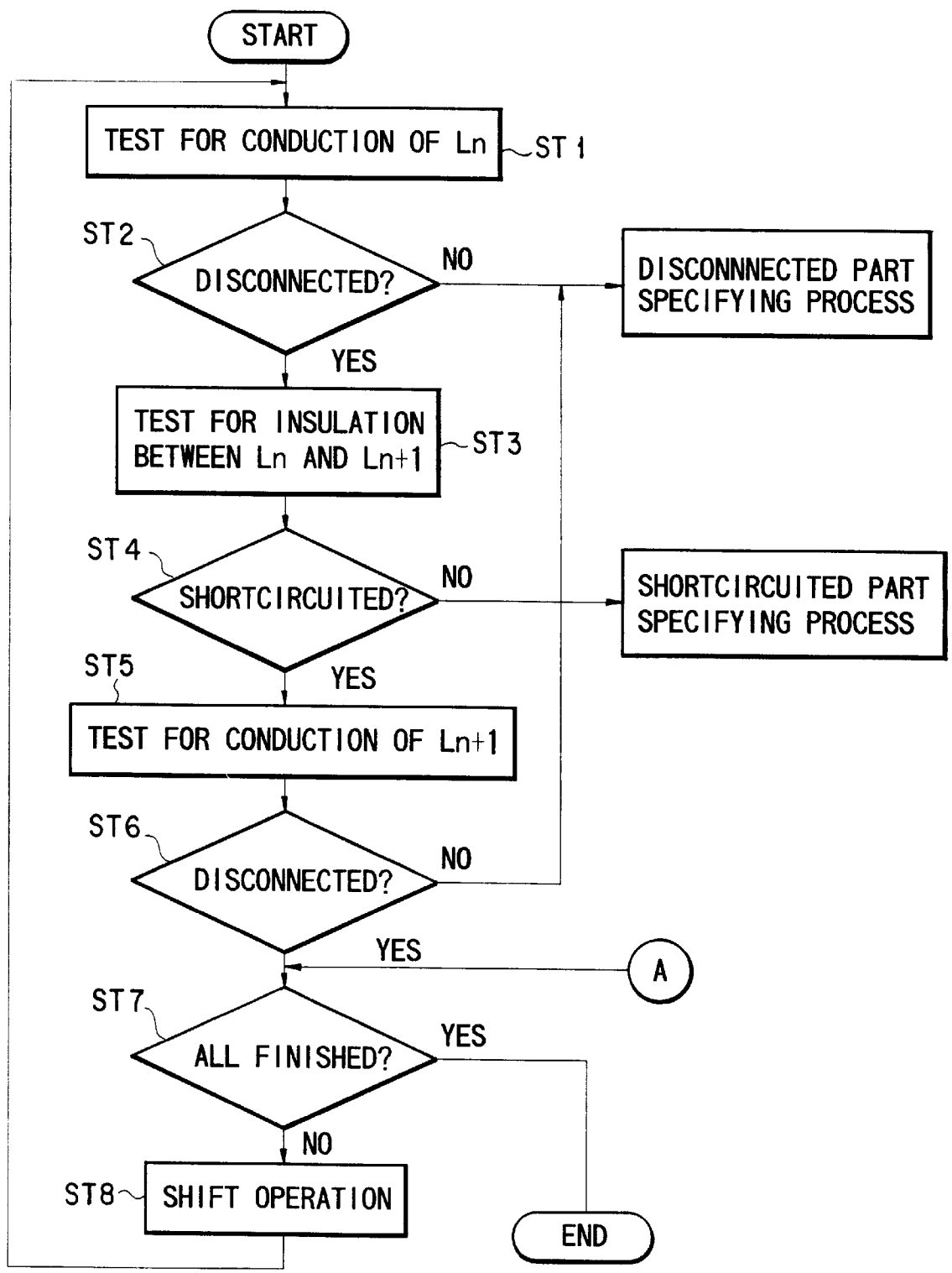
FIG. 7 is a flowchart illustrating the flow of the entire test operation of the conductor pattern test apparatus of this embodiment.
Figure 8:
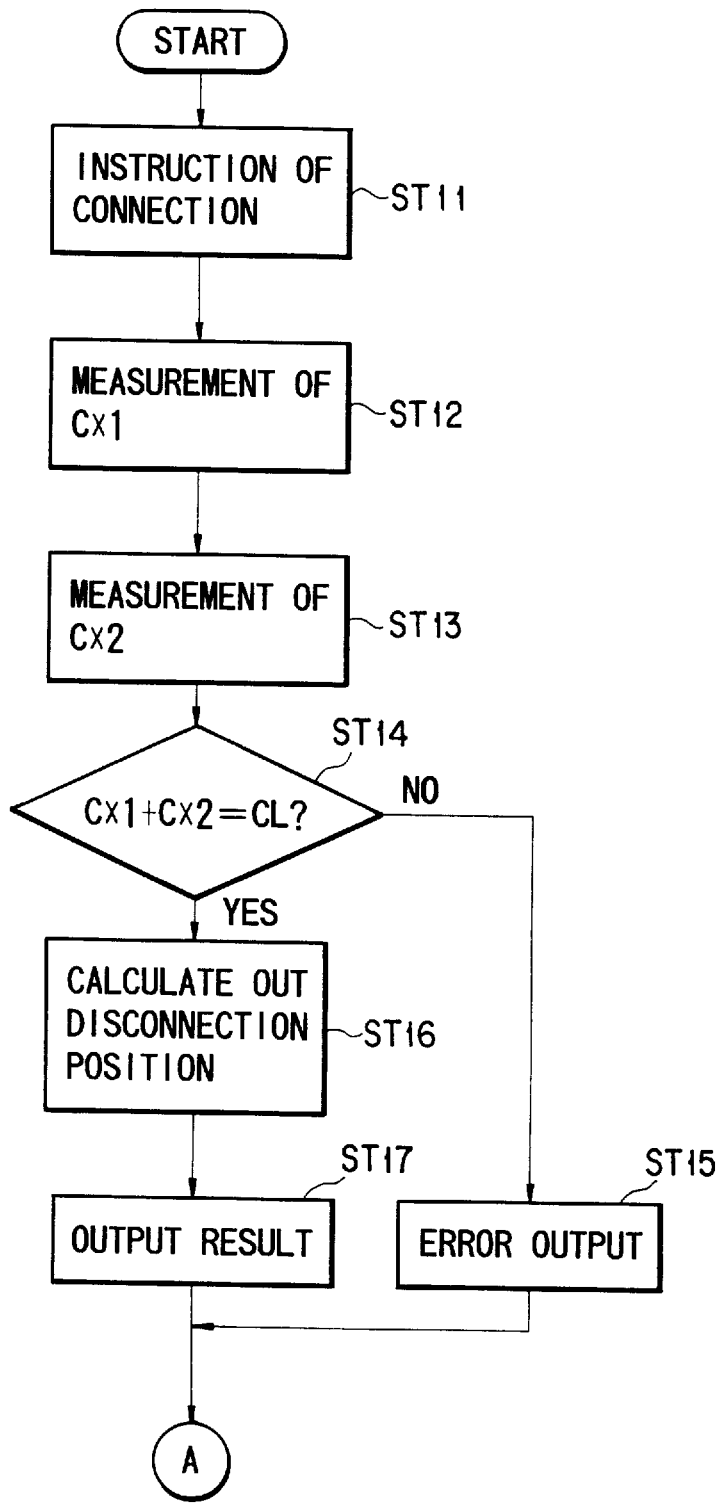
FIG. 8 is a flowchart illustrating the flow of the disconnected part locating operation in the test.

Each of FIGS. 7–9 is a flowchart showing a series of test operations. In detail, FIG. 7 shows the entire flow of operations, FIG. 8 shows a flow of the particular operations for locating a disconnected part, and FIG. 9 shows a flow of the particular operations for locating a short-circuited part. The operations of the conductor pattern test apparatus of this embodiment will be described with reference to these figures.

As the probe substrate 32, shown in FIGS. 2 and 3, is mounted on the LCD substrate 32, the line conduction test is carried out on one of gate electrodes Ln (or drain electrodes Ln when all the gate electrodes have been tested) (Step ST1). More specifically, an instruction is sent from the controller 10 to the relay controller 30, and the DC power source 22 and the measurement amplifier 28 are connected as in the connection state shown in FIG. 4. A particular DC voltage V1 is applied from the DC power source 22 to one end of a gate electrode, and an output voltage of the measurement amplifier 28 connected to the other end is read out by the controller 10, so as to measure a current M1.

Next, it is judged whether or not there is a disconnected part in the gate electrode picked up in the conduction test of step ST1 (step ST2). This judgment is made by the controller 10. In the case where no disconnected part is detected, an affirmative determination is made. Then, the insulation test between the gate electrode Ln picked up and a gate electrode Ln+1 adjacent thereto, is carried out (step ST3).

While maintaining the connection state shown in FIG. 4 and used in the conduction test of the step ST1, a predetermined DC voltage V1 is applied from the DC power source 22 to an end of one of the gate electrodes. At the same time, an output voltage of the measurement amplifier 28 connected to an end of the other gate electrode is read by the controller 10, thus measuring a current M2 (or a combination of V2 and M1 may be used). A leak resistance RLL is obtained by using the formulas (3)–(5).

Next, it is judged whether or not there is a leak (short-circuit) between two gate electrodes Ln and Ln+1 picked up in the line insulation test of step ST3 (step ST4). This judgment is made by the controller 10. In the case where no short-circuited part is found, an affirmative determination is carried out. Then, the line conduction test is carried out on the second gate electrode Ln+1 (step ST5). While maintaining the connection state shown in FIG. 4 and used in the conduction test of the step 701, a predetermined DC voltage V2 is applied from the DC power source 22 to an end of one of the gate electrode Ln+1. At the same time, an output voltage of the measurement amplifier 28 connected to the other end is read by the controller 10, thus measuring a current M2.

Next, it is judged whether or not there is a disconnected part in the gate electrode picked up in the conduction test of step 705 (step ST6). This judgment is made by the controller 10. In the case where no disconnected part is detected, an affirmative determination is made. Then, it is judged by the controller 10 whether or not the process of each step described above is completed with respect to all the gate electrodes and all the drain electrodes (step ST7). When the processes are all finished, an affirmative determination is carried out, thus completing the whole test operation.

In the case where the test is not finished for all the electrodes, a negative determination is made in the step ST7. Then, the controller 10 carries out a shift operation in which the gate electrode or drain electrode in the connection state shown in FIG. 4 is shifted by one line (step ST8). More specifically, the DC power source 22 and the measurement amplifier 28 are connected to two gate electrodes (or drain electrodes) shifted by one line, as in the connection state shown in FIG. 4.

After that, the operation step is reset to step ST1, and the line conduction test and the insulation test for testing insulation between lines, are repeated for all the gate electrodes and drain electrodes.

When a negative determination is made in the step ST2 or ST6 (judgment of whether or not there is a disconnected part), the process shown in FIG. 8 for locating the disconnected position is started. In this case, the capacitance CL between normal gate electrodes having no disconnected part, and the output voltage Vout0 of the measurement amplifier 28 are measured in advance.

First, the controller 10 sends an instruction to the relay controller 30, and the AC power source 20 and the measurement amplifier 28 are connected in the connection state shown in FIG. 5 (step ST11). Then, the controller 10 applies a predetermined AC voltage ACV1 from the AC power source 20 to an end of one gate electrode Ln+1, and at the same time, an output voltage Vout1 of the measurement amplifier 28 connected to an end of the other gate electrode Ln is read. From the relationship Cx1/CL=Vout1/Vout0, Cx1 is obtained (step ST12). Similarly, the controller 10 applies a predetermined AC voltage ACV2 from the AC power source 20 to an end of one gate electrode Ln+1, and at the same time, an output voltage Vout2 of the measurement amplifier 28 connected to an end of the other gate electrode Ln is read. From the relationship Cx2/CL=Vout2/Vout0, Cx2 is obtained (step ST13).

Next, the controller 10 judges whether or not the sum of Cx1 and Cx2 obtained in the steps ST12 and ST13 is substantially equal to CL (step ST14). In the case where the sum is not equal to CL, it is assumed that there are a plurality of disconnected parts in one of gate electrodes or the like, or a complex error caused by a large width of a disconnected part, and such a message is output from the display of the input/output device 12 and the printer 16 (step ST15). In the case where the sum of Cx1 and Cx2 is substantially equal to CL, an affirmative determination is made in step ST14. Next, the controller 10 calculates out the disconnected part on the basis of the equation (20) (step ST16), and the calculation results is output from the display of the input/output device 12 and the printer 16 (step ST17).

After the location of the disconnected part is finished as described above, the operation step is reset to the step ST7, and the series of operations are repeated.

In the case where there is a guard ring as shown in FIG. 6, the relationship between the position of a guard ring and the connecting positions of the AC power source 20 and the measurement amplifier 28 becomes important. Thus, if necessary, the connection state is shifted by 1 line, and thus the above two capacitances Cx1 and Cx2 are obtained.

When a negative determination is made in the step ST4 (judgment as to whether or not there is a short-circuited part), the process for locating a short-circuited part, illustrated in FIG. 9 is carried out. The following description is provided in connection with the case where there is no guard ring.

First, the controller 10 applies a predetermined DC voltage V1 from the DC power source 22 to an end of one gate electrode Ln, and at the same time, an output voltage of the measurement amplifier 28 connected to an end of the other gate electrode Ln+1 is read, thus measuring a current M2. From the measurement result, a resistance Ra–c (=V1/M2) between the points a and c shown in FIG. 4 (step ST21). Similarly, the controller 10 applies a predetermined DC voltage V2 from the DC power source 22 to an end of one gate electrode Ln+1, and at the same time, an output voltage of the measurement amplifier 28 connected to an end of the other gate electrode Ln is read, thus measuring a current M1. From the measurement result, a resistance Rb–d (=V2/M1) between the points b and d shown in FIG. 4 (step ST22).

Next, the controller 10 judges whether or not the sum of resistances Ra–c and Rb–d obtained in the steps ST21 and ST22 is substantially equal to twice the line resistance RL (step ST23). If so, an affirmative determination is made. Next, the controller 10 calculates out the distance Y1 from the left end to the leak part by using the equation (12) (step ST24), and the calculation result is output from the display of the input/output device 12 and the printer 16 (step ST25). In this case, the inherent resistance RL of the gate electrode may be inputted by the input/output device 12 or stored in the memory of the controller 10.

In the case where the sum of the resistances Ra–c and Rb–d is not substantially equal to twice the line resistance RL, a negative determination is carried out in step ST23. In such a case, it is assumed that a short-circuit of a wide leaking part occurs, or the short-circuit occurs at a plurality of parts. The distance Y1 from the left end to the leak part is calculated out by using the equation (12), and at the same time, the distance Y2 from the right end to the leak part is calculated out by using the equation (13) (step ST26). These calculation results are output from the display of the input/output device 12 and the printer 16 (step ST27).

After the location of the short-circuit part is finished, the process step is reset to the step ST7 shown in FIG. 7, and the above-described process is repeated.

In the case where a guide ring such as shown in FIG. 6 is provided, two gate electrodes or drain electrodes, which include a short-circuited part are not known in advance, and therefore it is necessary to locate the two electrodes or the like, which include a short-circuit, before the process of step ST21, in the procedure described in connection with the insulation test for testing insulation between lines (with a guard ring).

The conductor pattern test apparatus of this embodiment can locate a disconnected part and short-circuited part, in addition to the line conduction test and the insulation test for testing insulation between lines, which are carried out with a conventional device.

In the above-described embodiment, the conductor pattern test apparatus is designed to test both of disconnection and short-circuit of gate electrodes and drain electrodes of an LCD substrate; however the apparatus may be designed to test either one. In the case where the disconnection or short-circuit of scanning electrodes or signal electrodes of an LCD substrate of a simple matrix mode is tested, the same method as provided above can be applied. Further, the same method can be applied to conductor patterns other than that of an LCD substrate, for example, fine wiring within a semiconductor memory, a DSP or the like, or a conductor pattern such as wiring on a flexible substrate.

Figure 10:
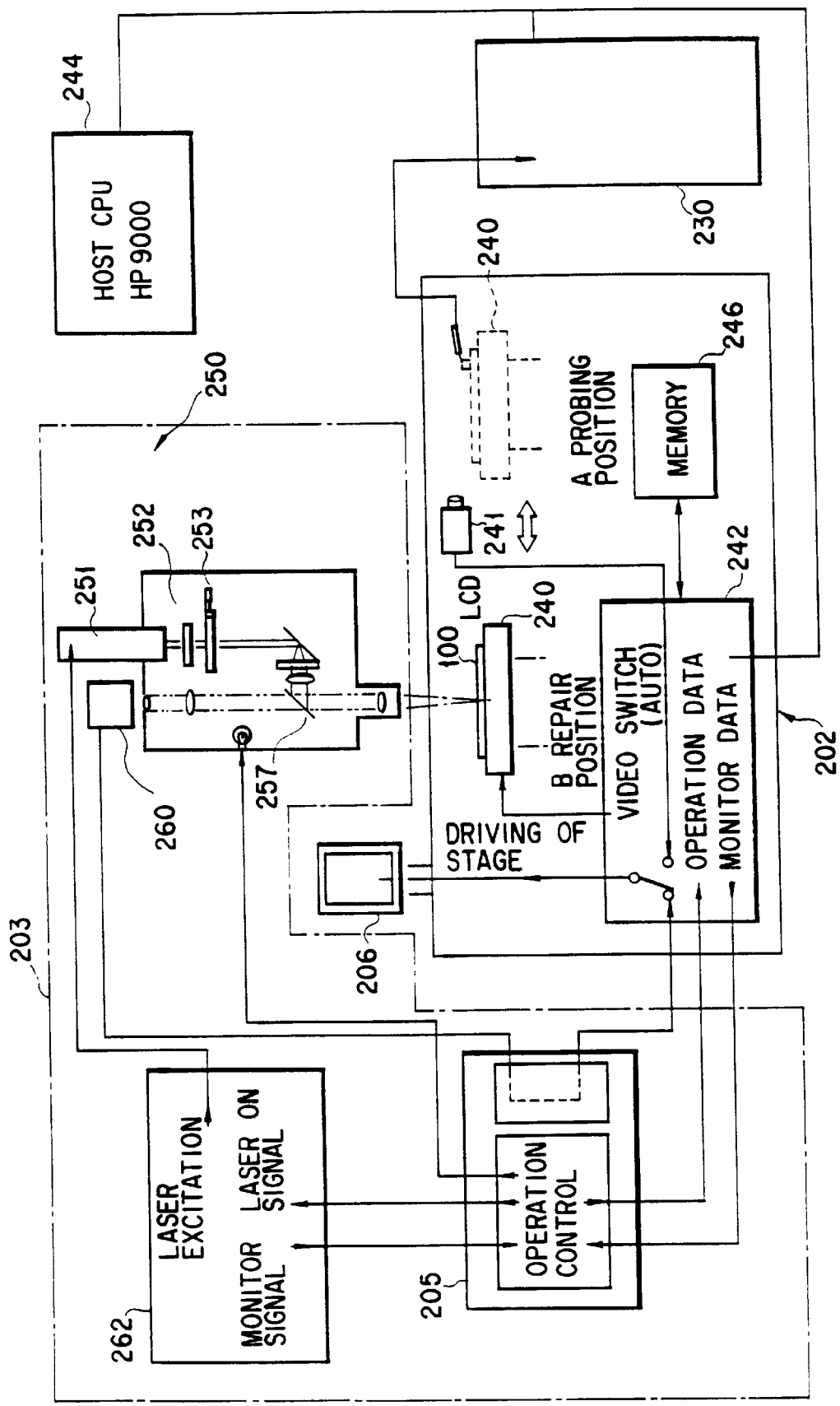
FIG. 10 is a circuit diagram showing a short-circuit repair machine to which the conductor pattern test apparatus of the present invention is applied.

Further, the located fault part may be sent via the GPIB interface 36 to a laser repair machine, where an automatic repair of the fault part is carried out. The following is a description of a repair machine which automatically repairs a short-circuited part detected by the conductor pattern test apparatus with reference to FIG. 10.

The conductor pattern test apparatus 230 is connected to the controller 242 of the probe apparatus 202. In the probe machine 202, a stage 240 on which an LCD substrate 100 is placed, and which is movable in X, Y and Z-axial directions, and in the direction in which the flat surface of the stage is rotated with respect to the Z axis as its rotational axis, i.e. θ direction, is provided. The stage 240 is movable to the laser repair machine 203.

The laser repair machine 203 has a laser repair unit 250 fixed above the probe device 202. The laser repair unit 250 includes a laser oscillator 251 for generating a laser beam for trimming a short-circuit pattern on the LCD substrate, and a repair monitor camera having an auto-focus function, which consists of a CCD camera for collecting data for alignment of the LCD 100 or monitor data for the operator. The laser oscillator 251 and a monitor camera 260 are arranged such that the laser optical axis and the alignment and monitor optical axis coincides above the substrate. That is, the laser beam emitted from the laser oscillator 251 is guided to a beam splitter 257 located on the optical axis of the repair monitor camera 260 via the N.D filter 252 and the aperture 253. When the laser beam is reflected on the beam splitter 257, the laser beam is applied on the LCD substrate 100 via an objective lens 258 located on the same optical axis.

Meanwhile, in the laser repair unit 250, an illumination lamp 261 is provided. Light emitted from the illumination lamp 261 is reflected on the LCD 100, and the reflection light is focused on the repair monitor camera 260 via the objective lens 258, the beam splitter 257 and an enlarging lens system. Thus, image pick-up data which shows an enlarged portion of the LCD substrate 100 can be collected.

As described, when the optical axis of the laser beam emitted from the laser oscillator 251 and the optical axis of the repair monitor camera 261 are made to coincide with each other, the laser beam can be accurately applied to the aligned position, thus preventing an illumination position error.

The emission of the laser from the laser oscillator 251 is carried out in the following manner. That is, a laser cut switch provided in an operation panel 205 is turned on, and the laser power 262 outputs a laser excitation signal to the laser oscillator 251. Upon reception of the laser excitation signal, the laser oscillator 251 emits a laser beam for cutting the short-circuit pattern of the LCD 100 onto the LCD 100.

Figure 11:
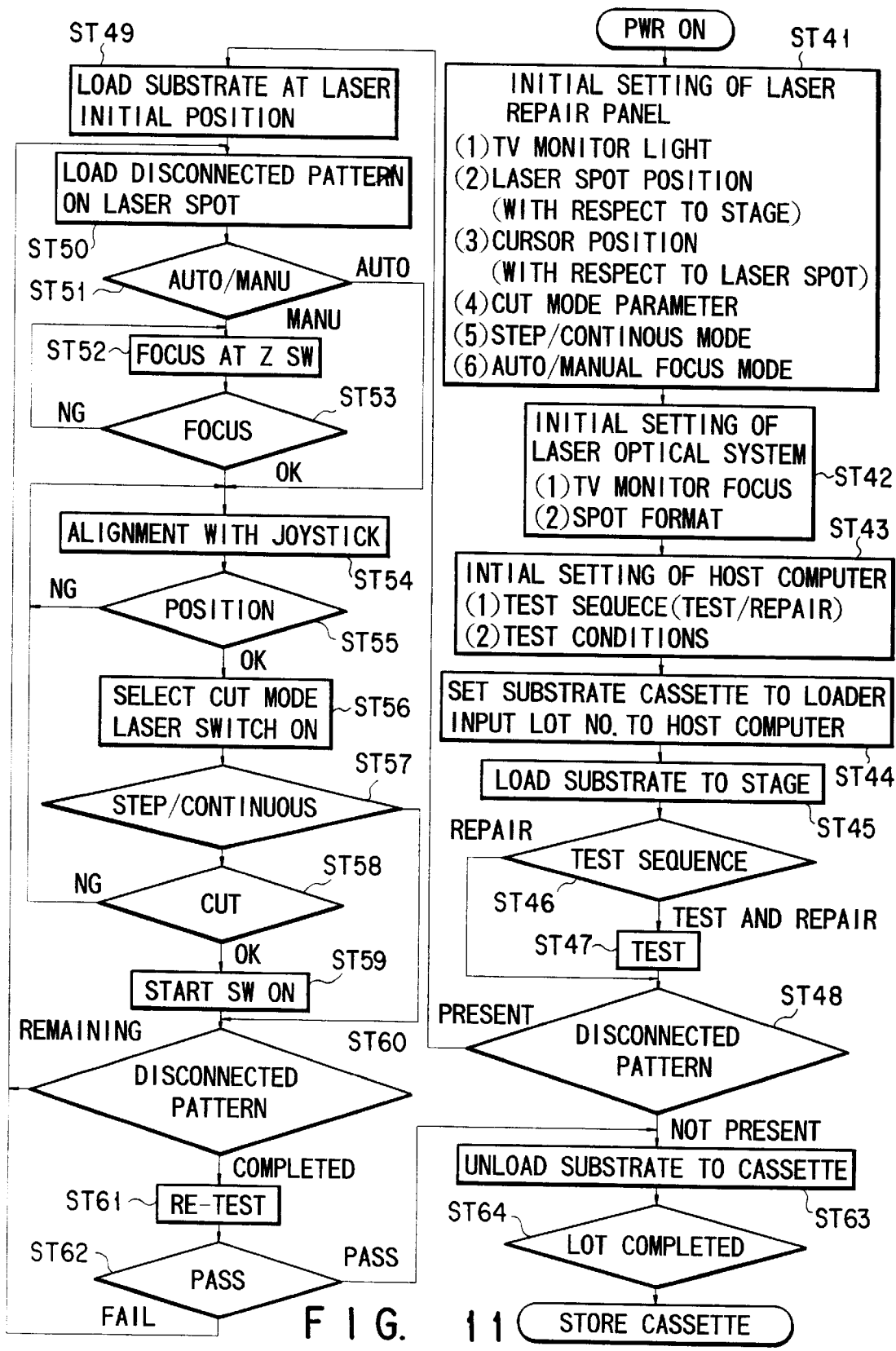
FIG. 11 is a flowchart illustrating the operation of the short-circuit repair machine shown in FIG. 10.

The operation of the laser repair device will be described with reference to the flowchart shown in FIG. 11.

When the power is turned on, the initial setting is carried out as in steps ST41–ST44. More specifically, in step ST41, the illumination of the TV monitor, the setting of the initial position of the laser spot, the setting of the initial position of the cursor, the setting of the cut mode parameter, the setting of the step/continuous mode, and the setting of the auto/manual focus mode. In steps ST42–ST44, the initial setting of the laser optical system, the initial setting of the CPU 244 and the loading of a substrate cassette to the loader unit 201 are carried out.

Next, the LCD substrate 100 is loaded onto the probe machine 202 from the loader unit 201 (step ST45). In step ST46, the test and repair mode is selected, and the detection of short-circuit is conducted in accordance with the flows shown in FIGS. 7 and 9. When a short-circuit is detected by the short-circuit detection (step ST48), the detection data, i.e. the short-circuit location data, is stored in a memory 246 from the GPIB interface 36 of the conductor pattern test apparatus 230 via the controller 242. After the detection of short-circuit is finished for all the patterns of the LCD substrate, the repair is started. The LCD substrate 100 containing a short-circuit is moved to the laser initial position of the repair device 203 as driven by the stage 240 (step ST45).

Next, the stage 240 is moved in accordance with the address data in the memory 246, and the position of the laser spot is made coincident with the position of the first short-circuit (step ST50). Further, it is identified whether such an operation is in an automatic or manual mode (step ST51). In the case of the manual operation, the stage 240 is driven in the Z direction by operating a Z-axial movement switch (not shown), thus carrying out focusing the repair monitor camera 260 (steps ST52 and ST53).

When the focusing is achieved by the manual mode, or the automatic mode is selected, the laser spot and the short-circuited pattern are aligned with each other (step ST54). In this alignment, the short-circuit pattern is shot with enlargement by the repair monitor camera 260, and the obtained image is displayed on the monitor TV 206. When the cursor displayed on the monitor 260 is made accord with the short-circuit pattern by operating, for example, a joy stick (not shown) (step ST56), a cut mode is selected. When a laser cut switch (not shown) is operated (step ST57), a laser beam is applied to the short-circuit pattern, and the short-circuited part is cut out, thus repairing the short-circuit.

Next, it is judged whether the operation is in a step driving or continuous driving mode. In the case of the continuous driving mode, it is further judged whether or not there is still a short-circuit pattern after the cutting operation (step ST60). If there is still a short-circuit pattern, the process is reset to step ST50.

In the case of the step driving mode, it is judged whether or not the cutting operation should be performed (step ST58). If so, a start switch (not shown) is operated (step ST59) so as to set the process to step ST60. In the case where there is still a short-circuit pattern, the process is reset to step ST50.

After the laser cutting operation is finished for all the short-circuit patterns, the stage 240 is set back to the probing position, and the short-circuit detection test is once again carried out on only the repaired parts of the repaired LCD substrate (step ST61).

As described above, when the detection and repair of the short-circuits are completed, and the result of the reexamination is approved (step ST62), the LCD substrate 100 is moved back to the carrier cassette of the loader unit 201 (step ST63). Thus, the same short-circuit detection and repair are carried out on all LCD substrates loaded in the loader unit, and when all lots are finished, a repair sequence is completed (step ST64).

Next, the disconnection repair process will be described.

Figure 12:
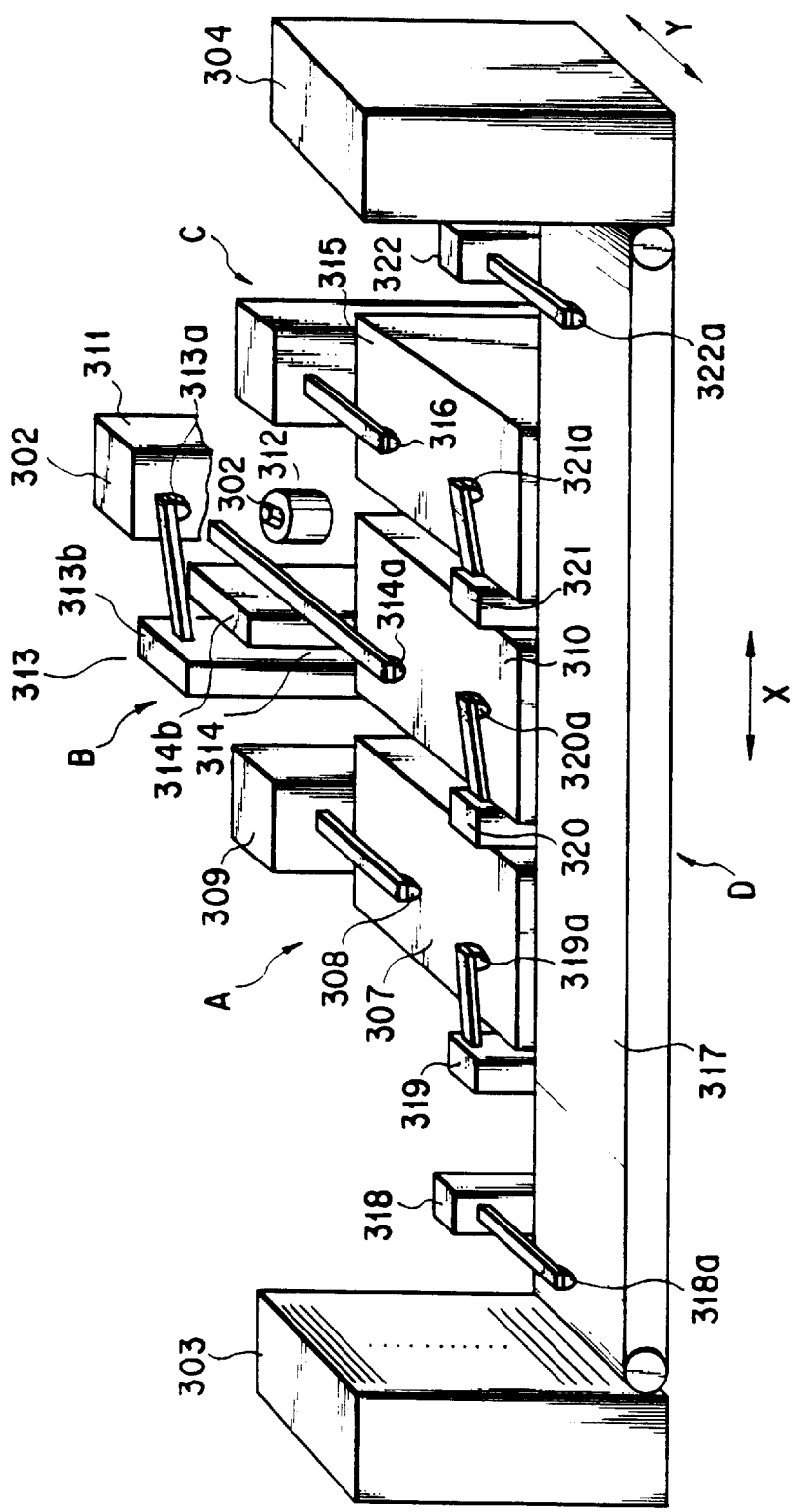
FIG. 12 is a perspective view of a disconnection repair machine to which the conductor pattern test apparatus of the present invention is applied.

As shown in FIG. 12, of a number of LCD substrates 100 loaded in the loader 303, those having disconnected patterns are conveyed on a conveying belt 317 by the first LCD conveyer 318. The conveyer belt 317 conveys an LCD substrate 100 towards a flux application section A, and when the LCD substrate 100 reaches the position of the flux application section A, the conveyer belt 317 stops. Then, the LCD substrate 100 is placed at a predetermined position on the first XY table 307 by the second LCD conveyer 319. After that, the XY table 307 moves in accordance with the disconnection position data from the conductor pattern test apparatus such that the disconnection position of the wiring pattern of the LCD substrate 100 is moved to situate underneath a flux head 308. When the disconnection position is situated underneath the flux head 308, the flux head 308 is descended until it reaches the disconnection position of the wiring pattern by the flux head driver 309, and a flux is applied to the disconnected part. Then, the flux head 308 is ascended to a predetermined position, and the LCD substrate 100 on the first XY table 310 is once again placed on the conveyer belt 317, and conveyed to the second XY table 310.

When the LCD substrate 100 is conveyed to a predetermined position of the second XY table 310, the conveyer belt 317 stops. Then, the third LCD conveyer 320 conveys the LCD substrate 100 on the conveyer belt 317 to a predetermined position of the second XY table 310, and the LCD substrate 100 is aligned on the second XY table 310.

In the meantime, one of a number of chips 302 stored in a pallet 311 is conveyed to a chip alignment unit 312 by the first chip conveyer 313, and that one chip 302 is aligned at a predetermined position on the XY plane by a chip alignment unit 312. The chip 302 aligned by the chip alignment unit 312 is conveyed to a predetermined position on the second XY table 310 by the chip conveyer 314.

The second XY table 310, which is controlled by the disconnection position data, moves the chip 302 such that the disconnected part of the conductor pattern of the LCD substrate 314 on which a flux was applied, is situated underneath the chip 302 set at the predetermined position on the second XY table 310 by the second chip conveyer 314.

After that, an adsorption head 14a is driven by a driver 314b in the second conveyer 314 and descended to such a position that the chip 302 adsorbed on the tip of the adsorption head 14a is brought into just contact with the disconnected part of the conductor pattern of the LCD substrate 100. Then, the adsorption of the adsorption head 14a is stopped. The chip 302 adsorbed by the adsorption head 14 is placed at the disconnected part of the conductor pattern of the LCD substrate 100, and the adsorption head 14a is driven by the driver 314a and ascended to a predetermined position.

The LCD substrate 100 in which the chip 302 is placed at the disconnected part is conveyed and placed once again onto the conveyer belt 317 by the third LCD conveyer 320.

Next, the LDC substrate 100 is conveyed towards a soldering unit C by the conveyer belt 317, and when the substrate is situated to a position close to the soldering unit C, the conveyer belt 317 is stopped. Then, the LCD substrate 100 on the conveyer belt 317 is conveyed and placed onto a predetermined position on the third XY table 315 by the fourth LCD conveyer 321.

The third XY table is controlled based on the disconnection position data, and the disconnected part of the conductor pattern of the LCD substrate 100 on which a flux was applied and the chip 302 is placed, is moved to a laser irradiation position of a YAG laser head 316. When the disconnected part reaches the irradiation position of a YAG laser head 316, a laser beam is applied on the chip 302 from the YAG laser head 316. The chip 302 is melted by the lease beam, and the disconnected part is soldered. After that, the LCD substrate whose disconnected conductor patter was repaired, is once again placed onto the conveyer belt 317 by the fourth LCD conveyer 321. The conveyer belt 317 conveys the repaired LCD substrate 100 to the unloading side, and the substrate is set in an unloader 304 by the fifth LCD conveyer 322. Thus, a series of the disconnection repair operations are completed.

As described, according to the present invention, a predetermined DC voltage is applied to an end of one of two conductor patterns which are short-circuited by a DC voltage source, and the current which is returned from the short-circuited part is detected at an end of the other conductor pattern by a current measurement device. The applied voltage value is divided by the measured current value so as to obtain the resistance from the end to the short-circuited part, and the ratio between thus obtained resistance and the known resistance of the conductor pattern is calculated by short-circuit calculation means, thereby detecting the short-circuited part.

Further, a predetermined AC voltage is applied to one end of a conductor pattern having a disconnected portion by a AC voltage source, and the voltage of a conductor pattern located adjacent to this conductor pattern is measured by a voltage measurement device. The capacitance of the above-described capacitor is calculated based on the obtained voltage ratios, and the ratio between the calculated capacitance and the known capacitance of two conductor patterns having no disconnected portion, is calculated by the disconnected part calculation circuit, thereby detecting the disconnected part.

Furthermore, the connection between the tester and a plurality of conductor patterns is carried out via the probing machine, and the connection between a conductor pattern via the probing portion and the above-mentioned DC voltage source, is switched by a relay based on the switching control of the controller. Therefore, after the probing portion is set for the conductor patterns to be tested, the detection of short-circuited parts and disconnected part can be automatically performed, thus significantly reducing the labor required for the test.

Lastly, since the detection can be automatized, the repair which is a later step, can be also automated, thus making it possible to remarkably shorten the time required for all the steps including the repair.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A conductor pattern test apparatus comprising:

DC voltage applying means connected selectively to a plurality of conductor patterns formed on a substrate for applying a predetermined DC voltage to an end of one of said conductor patterns;

current measurement means connected selectively to said conductor patterns for measuring a current flowing to another conductor pattern adjacent to said one of the conductor patterns via said end by said DC voltage applied to said end;

short-circuit position calculation means connected to said current measurement means and said DC voltage applying means for calculating a resistance value from said end to a short-circuited part of said one and another conductor patterns adjacent to each other, based on the current value measured by said current measurement means and the voltage value applied by said DC voltage applying means, and locating a position of said short-circuited part based on the calculated resistance value and a resistance value of a conductor pattern having no short-circuit;

AC voltage applying means for applying a predetermined AC voltage to an end of said one of the conductor patterns formed on said substrate;

voltage measurement means connected to said conductor patterns for measuring a voltage at an end of said another conductor pattern adjacent to said one of the conductor patterns when the AC voltage is applied to said one of the conductor patterns by said AC voltage applying means: and disconnection position calculation means for calculating a position of a disconnect based on a full length of a conductor pattern, a voltage value measured in a case in which no disconnection is present, and a voltage value measured in a case in which a disconnection is present.

2. A conductor pattern test apparatus according to claim 1, wherein said short-circuit position calculating means obtains a distance Y from said end to said short-circuited part from the following formula:

$$Y = \{V/(2 \cdot M \cdot RL)\} \cdot X$$

where M represents a current value measured by said current measurement means, V: said predetermined DC voltage applied by said voltage applying means, RL: a resistance value of a conductor pattern, and X: the full length of the conductor pattern.

3. A conductor pattern test apparatus according to claim 2, further comprising: additional DC voltage applying means for applying a predetermined DC voltage to an opposite end of the other conductor pattern; and additional current measurement means for measuring a current flowing to said opposite end of said one of the conductor patterns by the DC voltage applied by said additional DC voltage applying means, wherein said short-circuit position calculating means obtains a distance Y' from said opposite end to said short-circuited part from the following formula:

$$Y' = \{V'/(2 \cdot M' \cdot RL)\} \cdot X$$

where M' represents a current value measured by said additional current measurement means, V': said predetermined voltage applied by said additional voltage applying means, RL: a resistance value of a conductor pattern, and X; the full length of the conductor pattern.

4. A conductor pattern test apparatus according to claim 1, further comprising:

a probing portion electrically connected to said conductor patterns; and a relay connected to said probing portion, for consecutively switching a connection of said DC voltage applying means and said current measurement means to each one of said conductor patterns;

wherein said short-circuit position calculation means calculates a position of a short-circuit part for each one of said conductor patterns by switching of said relay.

5. A conductor pattern test apparatus according to claim 1, wherein said plurality of conductor patterns include a plurality of gate electrodes or drain electrodes arranged in parallel with each other on a LCD substrate on which a plurality of thin film transistors and a plurality of LCD elements are assembled.

6. A circuit repair apparatus comprising:

short-circuit detection means connected selectively to a plurality of conductor patterns formed on a substrate for detecting at least one short-circuited part of said conductor patterns;

said short-circuit detection means including:

DC voltage applying means connected selectively to said conductor patterns for applying a predetermined DC voltage to an end of one of said plurality of conductor patterns;

current measurement means connected selectively to said conductor patterns for measuring a current flowing to another conductor pattern adjacent to said one of the conductor patterns via said end by said DC voltage applied to said end; and short-circuit position calculation means connected to said current measurement means and said DC voltage applying means for calculating a resistance value from said end to the short-circuited part of said conductor patterns adjacent to each other, based on the current measured by said current measurement means and the voltage applied by said DC voltage applying means, and locating a position of said short-circuited part based on the calculated resistance value and a resistance value of a conductor pattern having no short-circuit;

laser cutting means connected to said short-circuit detection means for cutting out said short-circuited part detected by said short-circuit detection means by laser;

disconnection detection means for detecting at least one disconnected part of a plurality of conductor patterns;

said disconnection detection means including:

AC voltage applying means for applying a predetermined AC voltage to an end of one of said plurality of conductor patterns, voltage measurement means for measuring a voltage at an end of another conductor pattern adjacent to said one of the conductor patterns when the AC voltage is applied to said one of the conductor patterns by said AC voltage applying means, and disconnection position calculation means for locating a position of said disconnected part based on a full length of a conductor pattern a voltage measured in a case in which no disconnection is present, and a voltage measured in a case in which a disconnection is present;

means for placing a solder chip on the disconnected part detected by said disconnection means; and laser means for applying a laser beam on said solder disconnected part.

* * * * *

UNITED STATES PATENT AND TRADEMARK OFFICE
CERTIFICATE OF CORRECTION

PATENT NO.   : 5,844,199
DATED        : December 1, 1998
INVENTOR(S)  : Shinji IINO, et al.

It is certified that error appears in the above-identified patent and that said Letters Patent is hereby corrected as shown below:

On the title page, item [73], assignee is missing. It should be:

--[73]   Assignee:   TOKYO ELECTRON LIMITED, Tokyo, Japan
                     TEL Engineering Limited, Yamanashi, Japan--

On the title page, item [76], the address of the inventors should be:

--Yamanashi-ken, Japan--

Signed and Sealed this

Sixth Day of July, 1999

Attest:

Attesting Officer

Q. TODD DICKINSON

Acting Commissioner of Patents and Trademarks